United States Patent
Cheng et al.

(10) Patent No.: US 6,921,914 B2
(45) Date of Patent: Jul. 26, 2005

(54) PROCESS FOR PRODUCING SEMICONDUCTOR ARTICLE USING GRADED EPITAXIAL GROWTH

(75) Inventors: Zhi-Yuan Cheng, Cambridge, MA (US); Eugene A. Fitzgerald, Windham, NH (US); Dimitri A. Antoniadis, Newton, MA (US); Judy L. Hoyt, Belmont, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 10/802,185

(22) Filed: Mar. 17, 2004

(65) Prior Publication Data

US 2004/0173791 A1 Sep. 9, 2004

Related U.S. Application Data

(60) Continuation of application No. 10/384,160, filed on Mar. 7, 2003, now Pat. No. 6,737,670, which is a division of application No. 09/928,126, filed on Aug. 10, 2001, now Pat. No. 6,573,126.

(60) Provisional application No. 60/225,666, filed on Aug. 16, 2000.

(51) Int. Cl.[7] .................. H01L 29/06; H01L 31/0328; H01L 31/0336; H01L 31/072; H01L 31/109

(52) U.S. Cl. .............................. 257/19; 257/55; 257/63; 257/65; 257/200; 257/616

(58) Field of Search ............................. 257/19, 55, 65, 257/200, 616

(56) References Cited

U.S. PATENT DOCUMENTS 4,010,045 A  3/1977  Ruehrwein
4,704,302 A  11/1987  Bruel et al.
(Continued)

FOREIGN PATENT DOCUMENTS

DE  41 01 167    7/1992
EP  0 514 018    11/1992

(Continued)

OTHER PUBLICATIONS

JPAB Engligh Language Abstract of JP409219524A, Aug. 19, 1997.*

(Continued)

*Primary Examiner*—Craig A. Thompson
(74) *Attorney, Agent, or Firm*—Goodwin Procter LLP

(57) ABSTRACT

A process for producing monocrystalline semiconductor layers. In an exemplary embodiment, a graded $Si_{1-x}Ge_x$ (x increases from 0 to y) is deposited on a first silicon substrate, followed by deposition of a relaxed $Si_{1-y}Ge_y$ layer, a thin strained $Si_{1-z}Ge_z$ layer and another relaxed $Si_{1-y}Ge_y$ layer. Hydrogen ions are then introduced into the strained $Si_zGe_z$ layer. The relaxed $Si_{1-y}Ge_y$ layer is bonded to a second oxidized substrate. An annealing treatment splits the bonded pair at the strained Si layer, such that the second relaxed $Si_{1-y}Ge_y$ layer remains on the second substrate. In another exemplary embodiment, a graded $Si_{1-x}Ge_x$ is deposited on a first silicon substrate, where the Ge concentration x is increased from 0 to 1. Then a relaxed GaAs layer is deposited on the relaxed Ge buffer. As the lattice constant of GaAs is close to that of Ge, GaAs has high quality with limited dislocation defects. Hydrogen ions are introduced into the relaxed GaAs layer at the selected depth. The relaxed GaAs layer is bonded to a second oxidized substrate. An annealing treatment splits the bonded pair at the hydrogen ion rich layer, such that the upper portion of relaxed GaAs layer remains on the second substrate.

9 Claims, 5 Drawing Sheets

U.S. PATENT DOCUMENTS

| | | | |
|---|---|---|---|
| 4,710,788 A | 12/1987 | Dämbkes et al. | |
| 4,969,031 A | 11/1990 | Kobayashi et al. | |
| 4,987,462 A | 1/1991 | Kim et al. | |
| 4,990,979 A | 2/1991 | Otto | |
| 4,997,776 A | 3/1991 | Harame et al. | |
| 5,013,681 A | 5/1991 | Godbey et al. | |
| 5,091,767 A | 2/1992 | Bean et al. | |
| 5,155,571 A | 10/1992 | Wang et al. | |
| 5,166,084 A | 11/1992 | Pfiester | |
| 5,177,583 A | 1/1993 | Endo et al. | |
| 5,202,284 A | 4/1993 | Kamins et al. | |
| 5,207,864 A | 5/1993 | Bhat et al. | |
| 5,208,182 A | 5/1993 | Narayan et al. | |
| 5,212,110 A | 5/1993 | Pfiester et al. | |
| 5,221,413 A | 6/1993 | Brasen et al. | |
| 5,240,876 A | 8/1993 | Gaul et al. | |
| 5,241,197 A | 8/1993 | Murakami et al. | |
| 5,250,445 A | 10/1993 | Bean et al. | |
| 5,285,086 A | 2/1994 | Fitzgerald | |
| 5,291,439 A | 3/1994 | Kauffmann et al. | |
| 5,298,452 A | 3/1994 | Meyerson | |
| 5,310,451 A | 5/1994 | Tejwani et al. | |
| 5,316,958 A | 5/1994 | Meyerson | |
| 5,346,848 A | 9/1994 | Grupen-Shemansky et al. | |
| 5,374,564 A | 12/1994 | Bruel | |
| 5,399,522 A | 3/1995 | Ohori | |
| 5,413,679 A | 5/1995 | Godbey | |
| 5,424,243 A | 6/1995 | Takasaki | |
| 5,426,069 A | 6/1995 | Selvakumar et al. | |
| 5,426,316 A | 6/1995 | Mohammad | |
| 5,439,843 A | 8/1995 | Sakaguchi et al. | |
| 5,442,205 A | 8/1995 | Brasen et al. | |
| 5,461,243 A | 10/1995 | Ek et al. | |
| 5,461,250 A | 10/1995 | Burghartz et al. | |
| 5,462,883 A | 10/1995 | Dennard et al. | |
| 5,476,813 A | 12/1995 | Naruse | |
| 5,479,033 A | 12/1995 | Baca et al. | |
| 5,484,664 A | 1/1996 | Kitahara et al. | |
| 5,523,243 A | 6/1996 | Mohammad | |
| 5,523,592 A | 6/1996 | Nakagawa et al. | |
| 5,534,713 A | 7/1996 | Ismail et al. | |
| 5,536,361 A | 7/1996 | Kondo et al. | |
| 5,540,785 A | 7/1996 | Dennard et al. | |
| 5,548,128 A | 8/1996 | Soref et al. | |
| 5,572,043 A | 11/1996 | Shimizu et al. | |
| 5,596,527 A | 1/1997 | Tomioka et al. | |
| 5,607,876 A | 3/1997 | Biegelsen et al. | |
| 5,617,351 A | 4/1997 | Bertin et al. | |
| 5,630,905 A | 5/1997 | Lynch et al. | |
| 5,659,187 A | 8/1997 | Legoues et al. | |
| 5,683,934 A | 11/1997 | Candelaria | |
| 5,698,869 A | 12/1997 | Yoshimi et al. | |
| 5,714,777 A | 2/1998 | Ismail et al. | |
| 5,728,623 A | 3/1998 | Mori | |
| 5,739,567 A | 4/1998 | Wong | |
| 5,759,898 A | 6/1998 | Ek et al. | |
| 5,777,347 A | 7/1998 | Bartelink | |
| 5,786,612 A | 7/1998 | Otani et al. | |
| 5,786,614 A | 7/1998 | Chuang et al. | |
| 5,792,679 A | 8/1998 | Nakato | |
| 5,808,344 A | 9/1998 | Ismail et al. | |
| 5,847,419 A | 12/1998 | Imai et al. | |
| 5,863,830 A | 1/1999 | Bruel et al. | |
| 5,877,070 A | 3/1999 | Goesele et al. | |
| 5,882,987 A | 3/1999 | Srikrishnan | |
| 5,891,769 A | 4/1999 | Hong et al. | |
| 5,906,708 A | 5/1999 | Robinson et al. | |
| 5,906,951 A | 5/1999 | Chu et al. | |
| 5,912,479 A | 6/1999 | Mori et al. | |
| 5,923,046 A * | 7/1999 | Tezuka et al. | 257/24 |
| 5,943,560 A | 8/1999 | Chang et al. | |
| 5,963,817 A | 10/1999 | Chu et al. | |
| 5,966,622 A | 10/1999 | Levine et al. | |
| 5,993,677 A | 11/1999 | Biasse et al. | |
| 5,998,807 A | 12/1999 | Lustig et al. | |
| 6,013,134 A | 1/2000 | Chu et al. | |
| 6,013,563 A | 1/2000 | Henley et al. | |
| 6,020,252 A | 2/2000 | Aspar et al. | |
| 6,033,974 A | 3/2000 | Henley et al. | |
| 6,033,995 A | 3/2000 | Muller | |
| 6,058,044 A | 5/2000 | Sugiura et al. | |
| 6,059,895 A | 5/2000 | Chu et al. | |
| 6,074,919 A | 6/2000 | Gardner et al. | |
| 6,096,590 A | 8/2000 | Chan et al. | |
| 6,103,559 A | 8/2000 | Gardner et al. | |
| 6,103,597 A | 8/2000 | Aspar et al. | |
| 6,103,599 A | 8/2000 | Henley et al. | |
| 6,107,653 A | 8/2000 | Fitzgerald | |
| 6,111,267 A | 8/2000 | Fischer et al. | |
| 6,117,750 A | 9/2000 | Bensahel et al. | |
| 6,130,453 A | 10/2000 | Mei et al. | |
| 6,133,799 A | 10/2000 | Favors, Jr. et al. | |
| 6,140,687 A | 10/2000 | Shimomura et al. | |
| 6,143,636 A | 11/2000 | Forbes et al. | |
| 6,153,495 A | 11/2000 | Kub et al. | |
| 6,154,475 A | 11/2000 | Soref et al. | |
| 6,160,303 A | 12/2000 | Fattaruso | |
| 6,162,688 A | 12/2000 | Gardner et al. | |
| 6,162,705 A | 12/2000 | Henley et al. | |
| 6,184,111 B1 | 2/2001 | Henley et al. | |
| 6,190,998 B1 | 2/2001 | Bruel et al. | |
| 6,191,007 B1 | 2/2001 | Matsui et al. | |
| 6,191,432 B1 | 2/2001 | Sugiyama et al. | |
| 6,194,722 B1 | 2/2001 | Fiorini et al. | |
| 6,204,529 B1 | 3/2001 | Lung et al. | |
| 6,207,977 B1 | 3/2001 | Augusto | |
| 6,210,988 B1 | 4/2001 | Howe et al. | |
| 6,218,677 B1 | 4/2001 | Broekaert | |
| 6,225,192 B1 | 5/2001 | Aspar et al. | |
| 6,232,138 B1 | 5/2001 | Fitzgerald et al. | |
| 6,235,567 B1 | 5/2001 | Huang | |
| 6,242,324 B1 | 6/2001 | Kub et al. | |
| 6,249,022 B1 | 6/2001 | Lin et al. | |
| 6,251,751 B1 | 6/2001 | Chu et al. | |
| 6,251,755 B1 | 6/2001 | Furukawa et al. | |
| 6,261,929 B1 | 7/2001 | Gehrke et al. | |
| 6,266,278 B1 | 7/2001 | Harari et al. | |
| 6,271,551 B1 | 8/2001 | Schmitz et al. | |
| 6,271,726 B1 | 8/2001 | Fransis et al. | |
| 6,290,804 B1 | 9/2001 | Henley et al. | |
| 6,291,321 B1 | 9/2001 | Fitzgerald | |
| 6,303,468 B1 | 10/2001 | Aspar et al. | |
| 6,313,016 B1 | 11/2001 | Kibbel et al. | |
| 6,316,301 B1 | 11/2001 | Kant | |
| 6,323,108 B1 | 11/2001 | Kub et al. | |
| 6,326,667 B1 | 12/2001 | Sugiyama et al. | |
| 6,329,063 B2 | 12/2001 | Lo et al. | |
| 6,335,546 B1 | 1/2002 | Tsuda et al. | |
| 6,339,232 B1 | 1/2002 | Takagi | |
| 6,344,417 B1 | 2/2002 | Usenko | |
| 6,346,459 B1 | 2/2002 | Usenko et al. | |
| 6,350,993 B1 | 2/2002 | Chu et al. | |
| 6,352,909 B1 | 3/2002 | Usenko | |
| 6,355,493 B1 | 3/2002 | Usenko | |
| 6,368,733 B1 | 4/2002 | Nishinaga | |
| 6,368,938 B1 | 4/2002 | Usenko | |
| 6,369,438 B1 | 4/2002 | Sugiyama et al. | |
| 6,372,356 B1 | 4/2002 | Thornton et al. | |
| 6,372,593 B1 | 4/2002 | Hattori et al. | |
| 6,372,609 B1 | 4/2002 | Aga et al. | |
| 6,387,829 B1 | 5/2002 | Usenko et al. | |

| | | |
|---|---|---|
| 6,391,740 B1 | 5/2002 | Cheung et al. |
| 6,399,970 B2 | 6/2002 | Kubo et al. |
| 6,403,975 B1 | 6/2002 | Brunner et al. |
| 6,407,406 B1 | 6/2002 | Tezuka |
| 6,410,371 B1 | 6/2002 | Yu et al. |
| 6,425,951 B1 | 7/2002 | Chu et al. |
| 6,429,061 B1 | 8/2002 | Rim |
| 6,445,016 B1 | 9/2002 | An et al. |
| 6,448,152 B1 | 9/2002 | Henley et al. |
| 6,455,397 B1 | 9/2002 | Belford |
| 6,458,672 B1 | 10/2002 | Henley et al. |
| 6,475,072 B1 | 11/2002 | Canaperi et al. |
| 6,489,639 B1 | 12/2002 | Hoke et al. |
| 6,514,836 B2 | 2/2003 | Belford |
| 6,515,335 B1 | 2/2003 | Christiansen et al. |
| 6,521,041 B2 | 2/2003 | Wu et al. |
| 6,524,935 B1 | 2/2003 | Canaperi et al. |
| 6,534,381 B2 | 3/2003 | Cheung et al. |
| 6,555,839 B2 | 4/2003 | Fitzgerald et al. |
| 6,573,126 B2 | 6/2003 | Cheng et al. |
| 6,583,015 B2 | 6/2003 | Fitzgerald et al. |
| 6,583,437 B2 | 6/2003 | Mizuno et al. |
| 6,591,321 B1 | 7/2003 | Arimilli et al. |
| 6,593,191 B2 | 7/2003 | Fitzgerald |
| 6,593,625 B2 | 7/2003 | Christiansen et al. |
| 6,596,610 B1 | 7/2003 | Kuwabara et al. |
| 6,597,016 B1 | 7/2003 | Yuki et al. |
| 6,602,613 B1 | 8/2003 | Fitzgerald |
| 6,603,156 B2 | 8/2003 | Rim |
| 6,607,948 B1 | 8/2003 | Sugiyama et al. |
| 6,624,047 B1 | 9/2003 | Sakaguchi et al. |
| 6,624,478 B2 | 9/2003 | Anderson et al. |
| 6,632,724 B2 | 10/2003 | Henley et al. |
| 6,635,909 B2 | 10/2003 | Clark et al. |
| 6,645,831 B1 | 11/2003 | Shaheen et al. |
| 6,646,322 B2 | 11/2003 | Fitzgerald |
| 6,649,492 B2 | 11/2003 | Chu et al. |
| 6,656,271 B2 | 12/2003 | Yonehara et al. |
| 6,664,169 B1 | 12/2003 | Iwasaki et al. |
| 6,674,150 B2 | 1/2004 | Takagi et al. |
| 6,677,183 B2 | 1/2004 | Sakaguchi et al. |
| 6,677,192 B1 | 1/2004 | Fitzgerald |
| 6,680,240 B1 | 1/2004 | Maszara |
| 6,680,260 B2 | 1/2004 | Akiyama et al. |
| 6,690,043 B1 | 2/2004 | Usuda et al. |
| 6,703,144 B2 | 3/2004 | Fitzgerald |
| 6,703,688 B1 | 3/2004 | Fitzgerald |
| 6,706,614 B1 | 3/2004 | An et al. |
| 6,706,618 B2 | 3/2004 | Takisawa et al. |
| 6,707,106 B1 | 3/2004 | Wristers et al. |
| 6,709,903 B2 | 3/2004 | Christiansen et al. |
| 6,709,909 B2 | 3/2004 | Mizuno et al. |
| 6,713,326 B2 | 3/2004 | Cheng et al. |
| 6,737,670 B2 | 5/2004 | Cheng et al. |
| 6,750,130 B1 | 6/2004 | Fitzgerald |
| 6,828,214 B2 | 12/2004 | Notsu et al. |
| 2001/0003364 A1 | 6/2001 | Sugawara et al. |
| 2001/0007789 A1 | 7/2001 | Aspar et al. |
| 2002/0043660 A1 | 4/2002 | Yamazaki et al. |
| 2002/0052084 A1 | 5/2002 | Fitzgerald |
| 2002/0084000 A1 | 7/2002 | Fitzgerald |
| 2002/0096717 A1 | 7/2002 | Chu et al. |
| 2002/0100942 A1 | 8/2002 | Fitzgerald et al. |
| 2002/0123167 A1 | 9/2002 | Fitzgerald |
| 2002/0123183 A1 | 9/2002 | Fitzgerald |
| 2002/0123197 A1 | 9/2002 | Fitzgerald et al. |
| 2002/0125471 A1 | 9/2002 | Fitzgerald et al. |
| 2002/0125497 A1 | 9/2002 | Fitzgerald |
| 2002/0168864 A1 | 11/2002 | Cheng et al. |
| 2003/0003679 A1 | 1/2003 | Doyle et al. |
| 2003/0013305 A1 | 1/2003 | Sugii et al. |
| 2003/0013323 A1 | 1/2003 | Hammond et al. |
| 2003/0025131 A1 | 2/2003 | Lee et al. |
| 2003/0034529 A1 | 2/2003 | Fitzgerald et al. |
| 2003/0057439 A1 | 3/2003 | Fitzgerald |
| 2003/0077867 A1 | 4/2003 | Fitzgerald |
| 2003/0102498 A1 | 6/2003 | Braithwaite et al. |
| 2003/0119280 A1 | 6/2003 | Lee et al. |
| 2003/0127646 A1 | 7/2003 | Christiansen et al. |
| 2003/0139000 A1 | 7/2003 | Bedell et al. |
| 2003/0157787 A1 | 8/2003 | Murthy et al. |
| 2003/0160300 A1 | 8/2003 | Takenaka et al. |
| 2003/0168654 A1 | 9/2003 | Cheng et al. |
| 2003/0178681 A1 | 9/2003 | Clark et al. |
| 2003/0189229 A1 | 10/2003 | Mouli |
| 2003/0199126 A1 | 10/2003 | Chu et al. |
| 2003/0201458 A1 | 10/2003 | Clark et al. |
| 2003/0203600 A1 | 10/2003 | Chu et al. |
| 2003/0207127 A1 | 11/2003 | Murthy et al. |
| 2003/0215990 A1 | 11/2003 | Fitzgerald et al. |
| 2003/0218189 A1 | 11/2003 | Christiansen et al. |
| 2003/0219957 A1 | 11/2003 | Kuwabara et al. |
| 2003/0227036 A1 | 12/2003 | Sugiyama et al. |
| 2003/0227057 A1 | 12/2003 | Lochtefeld et al. |
| 2003/0230778 A1 | 12/2003 | Park et al. |
| 2003/0232467 A1 | 12/2003 | Anderson et al. |
| 2004/0005740 A1 | 1/2004 | Lochtefeld et al. |
| 2004/0007724 A1 | 1/2004 | Murthy et al. |
| 2004/0009649 A1 | 1/2004 | Kub et al. |
| 2004/0012037 A1 | 1/2004 | Venkatesan et al. |
| 2004/0012075 A1 | 1/2004 | Bedell et al. |
| 2004/0014304 A1 | 1/2004 | Bhattacharyya |
| 2004/0018699 A1 | 1/2004 | Boyd et al. |
| 2004/0031979 A1 | 2/2004 | Lochtefeld et al. |
| 2004/0031990 A1 | 2/2004 | Jin et al. |
| 2004/0041174 A1 | 3/2004 | Okihara |
| 2004/0041210 A1 | 3/2004 | Mouli |
| 2004/0048091 A1 | 3/2004 | Sato et al. |
| 2004/0048454 A1 | 3/2004 | Sakaguchi |
| 2004/0051140 A1 | 3/2004 | Bhattacharyya |
| 2004/0053477 A1 | 3/2004 | Ghyselen et al. |
| 2004/0075149 A1 | 4/2004 | Fitzgerald et al. |

FOREIGN PATENT DOCUMENTS

| | | | |
|---|---|---|---|
| EP | 0 587 520 | 3/1994 | |
| EP | 0 683 522 | 11/1995 | |
| EP | 0 828 296 | 3/1998 | |
| EP | 0 829 908 | 3/1998 | |
| EP | 0 838 858 | 4/1998 | |
| EP | 1 020 900 | 7/2000 | |
| EP | 1 174 928 | 1/2002 | |
| GB | 2 342 777 | 4/2000 | |
| JP | 61-141116 | 6/1986 | |
| JP | 2-210816 | 8/1990 | |
| JP | 3-036717 | 2/1991 | |
| JP | 4-307974 | 10/1992 | |
| JP | 5-166724 | 7/1993 | |
| JP | 6-177046 | 6/1994 | |
| JP | 6-244112 | 9/1994 | |
| JP | 7-106446 | 4/1995 | |
| JP | 7-240372 | 9/1995 | |
| JP | 409219524 A * | 8/1997 | ......... H01L/29/786 |
| JP | 10-270685 | 10/1998 | |
| JP | 11-233744 | 8/1999 | |
| JP | 2000-31491 | 1/2000 | |
| JP | 2000-021783 | 1/2000 | |
| JP | 2001319935 | 5/2000 | |
| JP | 2002-076334 | 3/2002 | |
| JP | 2002-164520 | 6/2002 | |
| JP | 2002-289533 | 10/2002 | |
| WO | WO 98/59365 | 12/1998 | |
| WO | WO 99/53539 | 10/1999 | |

| | | |
|---|---|---|
| WO | WO 00/48239 | 8/2000 |
| WO | WO 00/54338 | 9/2000 |
| WO | WO 01/022482 | 3/2001 |
| WO | WO 01/54202 | 7/2001 |
| WO | WO 01/93338 | 12/2001 |
| WO | WO 01/99169 A2 | 12/2001 |
| WO | WO 02/13262 | 2/2002 |
| WO | WO 02/15244 A2 | 2/2002 |
| WO | WO 02/27783 A1 | 4/2002 |
| WO | WO 02/47168 | 6/2002 |
| WO | WO 02/071488 | 9/2002 |
| WO | WO 02/071491 | 9/2002 |
| WO | WO 02/071495 A1 | 9/2002 |
| WO | WO 02/082514 A1 | 10/2002 |
| WO | WO 04/006311 A2 | 1/2004 |
| WO | WO 04/006326 A1 | 1/2004 |
| WO | WO 04/006327 A2 | 1/2004 |
| WO | WO 04/019403 A2 | 3/2004 |
| WO | WO 04/019404 A2 | 3/2004 |

OTHER PUBLICATIONS

Powell, A.R. et al. "New approach to the growth of low dislocation relaxed SiGe material," Applied Physics Letters 64(14) pp. 1856–1858, Apr. 4, 1994.*

Grillot et al., "Acceptor diffusion and segregation in $(Al_xGa_{1-x})_{0.5}In_{0.5}P$ heterostructures," *Journal of Applied Physics*, vol. 91, No. 8 (2002), pp. 4891–4899.

Halsall et al., "Electron diffraction and Raman studies of the effect of substrate misorientation on ordering in the AlGaInP system," *Journal of Applied Physics*, vol. 85, No. 1 (1999), pp. 199–202.

Hsu et al., "Surface morphology of related $Ge_xSi_{1-x}$ films," *Appl. Phys. Lett.*, vol. 61, No. 11 (1992), pp. 1293–1295.

"2 Bit/Cell EEPROM Cell Using Band to Band Tunneling for Data Read–Out," IBM Technical Disclosure Bulletin, vol. 35, No. 4B (Sep. 1992) pp. 136–140.

Armstrong et al., "Design of Si/SiGe Heterojunction Complementary Metal–Oxide–Semiconductor Transistors," *IEDM Technical Digest* (1995) pp. 761–764.

Armstrong, "Technology for SiGe Heterostructure–Based CMOS Devices", Ph.D Thesis, Massachusetts Institute of Technology (1999) pp. 1–154.

Augusto et al., "Proposal for a New Process Flow for the Fabrication of Silicon–Based Complementary MOD–MOSFETs without Ion Implantation," *Thin Solid Films*, vol. 294, No. 1–2 (1997) pp. 254–258.

Barradas et al., "RBS analysis of MBE–grown SiGe/(001) Si heterostructures with thin, high Ge content SiGe channels for HMOS transistors," *Modern Physics Letters B* (2001) (abstract).

Borenstein et al., "A New Ultra–Hard Etch–Stop Layer for High Precision Micromachining," *Proceedings of the 1999 12th IEEE International Conference on Micro Electro Mechanical Systems MEMs)* (Jan. 17–21, 1999) pp. 205–210.

Bouillon et al., "Search for the optimal channel architecture for 0.18/0.12 µm bulk CMOS Experimental study," IEEE (1996) pp. 21.2.1–21.2.4.

Bruel et al., "®SMART CUT: A Promising New SOI Material Technology," *Proceedings 1995 IEEE International SOI Conference* (Oct. 1995) pp. 178–179.

Bruel, "Silicon on Insulator Material Technology," *Electronic Letters*, vol. 13, No. 14 (Jul. 6, 1995) pp. 1201–1202.

Bufler et al., "Hole transport in strained $Si_{1-x}Ge_x$ alloys on Si1–yGey substrates," *Journal of Applied Physics*, vol. 84, No. 10 (Nov. 15, 1998) pp. 5597–5602.

Burghartz et al., "Microwave Inductors and Capacitors in Standard Multilevel Interconnect Silicon Technology", *IEEE Transactions on Microwave Theory and Techniques*, vol. 44, No. 1 (Jan. 1996) pp. 100–104.

Canaperi et al., "Preparation of a relaxed Si–Ge layer on an insulator in fabricating high–speed semiconductor devices with strained epitaxial films," International Business Machines Corporation, USA (2002) (abstract).

Carlin et al., "High Efficiency GaAs–on–Si Solar Cells with High Voc Using Graded GeSi Buffers," IEEE (2000) pp. 1006–1011.

Chang et al., "Selective Etching of SiGe/Si Heterostructures," *Journal of the Electrochemical Society*, No. 1 (Jan. 1991) pp. 202–204.

Cheng et al., "Electron Mobility Enhancement in Strained–Si n–MOSFETs Fabricated on SiGe–on–Insulator (SGOI) Substrates," *IEEE Electron Device Letters*, vol. 22, No. 7 (Jul. 2001) pp. 321–323.

Cheng et al., "Relaxed Silicon–Germanium on Insulator Substrate by Layer Transfer," *Journal of Electronic Materials*, vol. 30, No. 12 (2001) pp. L34–L39.

Cullis et al, "Growth ripples upon strained SiGe epitaxial layers on Si and misfit dislocation interactions," *Journal of Vacuum Science and Technology A*, vol. 12, No. 4 (Jul./Aug. 1994) pp. 1924–1931.

Currie et al., "Carrier mobilities and process stability of strained Si n– and p–MOSFETs on SiGe virtual substrates," *J. Vac. Sci. Technol. B.*, vol. 19, No. 6 (Nov./Dec. 2001) pp. 2268–2279.

Currie et al., "Controlling Threading Dislocation in Ge on Si Using Graded SiGe Layers and Chemical–Mechanical Polishing," vol. 72 No. 14 (Apr. 6, 1998) pp. 1718–1720.

Eaglesham et al., "Dislocation–Free Stranski–Krastanow Growth of Ge on Si(100)," *Physical Review Letters*, vol. 64, No. 16 (Apr. 16, 1990) pp. 1943–1946.

Feijoo et al., "Epitaxial Si–Ge Etch Stop Layers with Ethylene Diamine Pyrocatechol for Bonded and Etchback Silicon–on–Insulator," *Journal of Electronic Materials*, vol. 23, No. 6 (Jun. 1994) pp. 493–496.

Fischetti et al., "Band structure, deformation potentials, and carrier mobility in strained Si, Ge, and SiGe alloys," *J. Appl. Phys.*, vol. 80, No. 4 (Aug. 15, 1996) pp. 2234–2252.

Fischetti, "Long–range Coulomb interactions in small Si devices. Part II. Effective electron mobility in thin–oxide structures," *Journal of Applied Physics*, vol. 89, No. 2 (Jan. 15, 2001) pp. 1232–1250.

Fitzgerald et al., "Dislocation dynamics in relaxed graded composition semiconductors," *Materials Science and Engineering B67* (1999) pp. 53–61.

Fitzgerald et al., "Relaxed $Ge_xSi_{1-x}$ structures for III–V integration with Si and high mobility two–dimensional electron gases in Si," AT&T Bell Laboratories, Murray Hill, NJ 07974 (1992) *American Vacuum Society*, pp. 1807–1819.

Fitzgerald et al., "Totally Relaxed $Ge_xSi_{1-x}$ Layers with Low Threading Dislocation Densities Grown on Si Substrates," *Applied Physics Letters*, vol. 59, No. 7 (Aug. 12, 1991) pp. 811–813.

Garone et al., "Silicon vapor phase epitaxial growth catalysis by the presence of germane," *Applied Physics Letters*, vol. 56, No. 13 (Mar. 26, 1990) pp. 1275–1277.

Godbey et al., (1990) "Fabrication of Bond and Etch–Back Silicon Insulator Using a Strained $Si_{0.7}GE_{0.3}$ Layer as an Etch Stop," *Journal of the Electrical Society*, vol. 137, No. 10 (Oct. 1990) pp. 3219–3223.

Gray and Meyer, "Phase–Locked Loops", *Analysis and Design of Analog Integrated Circuits* (1984) pp. 605–632.

Grützmacher et al., "Ge segregation in SiGe/Si heterostructures and its dependence on deposition technique and growth atmosphere," *Applied Physics Letters*, vol. 63, No. 18 (Nov. 1, 1993) pp. 2531–2533.

Hackbarth et al., "Alternatives to thick MBE–grown relaxed SiGe buffers," *Thin Solid Films*, vol. 369, No. 1–2 (Jul. 2000) pp. 148–151.

Hackbarth et al., "Strain relieved SiGe buffers for Si–based heterostructure field–effect transistors," *Journal of Crystal Growth*, vol. 201/202 (1999) pp. 734–738.

Herzog et al., "SiGe–based FETs: buffer issues and device results," *Thin Solid Films*, vol. 380 (2000) pp. 36–41.

Höck et al., "Carrier mobilities in modulation doped $Si_{1-x}Ge_x$ heterostructures with respect to FET applications," *Thin Solid Films*, vol. 336 (1998) pp. 141–144.

Höck et al., "High hole mobility in $Si_{0.17}Ge_{0.83}$ channel metal–oxide–semiconductor field–effect transistors grown by plasma–enhanced chemical vapor deposition," *Applied Physics Letters*, vol. 76, No. 26 (Jun. 26, 2000) pp. 3920–3922.

Höck et al., "High performance 0.25 $\mu$m p–type Ge/SiGe MODFETs," *Electronics Letters*, vol. 34, No. 19 (Sep. 17, 1998) pp. 1888–1889.

Huang et al., (2001) "Carrier Mobility enhancement in strained Si–on–insulatoir fabricated by wafer bonding", *2001 Symposium on VLSI Technology, Digest of Technical Papers*, pp. 57–58.

Huang et al., "High–quality strain–relaxed SiGe alloy grown on implanted silicon–on–insulator substrate," *Applied Physics Letters*, vol. 76, No. 19 (May 8, 2000) pp. 2680–2682.

Huang et al., "The Impact of Scaling Down to Deep Submicron on CMOS RF Circuits", IEEE Journal of Solid–State Circuits, vol. 33, No. 7, Jul., 1998, pp. 1023–1036.

IBM Technical Disclosure Bulletin, vol. 32, No. 8A, Jan. 1990, "Optimal Growth Technique and Structure for Strain Relaxation of Si–Ge Layers on Si Substrates", pp. 330–331.

Ishikawa et al., "Creation of Si–Ge–based SIMOX structures by low energy oxygen implantation," *Proceedings 1997 IEEE International SOI Conference* (Oct. 1997) pp. 16–17.

Ishikawa et al., "SiGe–on–insulator substrate using SiGe alloy grown Si(001)," *Applied Physics Letters*, vol. 75, No. 7 (Aug. 16, 1999) pp. 983–985.

Ismail et al., "Modulation–doped n–type Si/SiGe with inverted interface," *Appl. Phys. Lett.*, vol. 65, No. 10 (Sep. 5, 1994) pp. 1248–1250.

Ismail, "Si/SiGe High–Speed Field–Effect Transistors," *Electron Devices Meeting, Washington, D.C.*, (Dec. 10, 1995) pp. 20.1.1–20.1.4.

Kearney et al., "The effect of alloy scattering on the mobility of holes in a $Si_{1-x}Ge_x$ quantum well," *Semicond. Sci Technol.*, vol. 13 (1998) pp. 174–180.

Kim et al., "A Fully Integrated 1.9–GHz CMOS Low–Noise Amplifier," *IEEE Microwave and Guided Wave Letters*, vol. 8, No. 8 (Aug. 1998) pp. 293–295.

Koester et al., "Extremely High Transconductance Ge/$Si_{0.4}Ge_{0.6}$ p–MODFET's Grown by UHV–CVD," *IEEE Electron Device Letters*, vol. 21, No. 3 (Mar. 2000) pp. 110–112.

König et al., "Design Rules for n–Type SiGe Hetero FETs," *Solid State Electronics*, vol. 41, No. 10 (1997), pp. 1541–1547.

König et al., "p–Type Ge–Channel MODFET's with High Transconductance Grown on Si Substrates," *IEEE Electron Device Letters*, vol. 14, No. 4 (Apr. 1993) pp. 205–207.

König et al., "SiGe HBTs and HFETs," *Solid–State Electronics*, vol. 38, No. 9 (1995) pp. 1595–1602.

Kummer et al., "Low energy plasma enhanced chemical vapor deposition," *Materials Science and Engineering B89* (2002) pp. 288–295.

Kuznetsov et al., "Technology for high–performance n–channel SiGe modulation–doped field–effect transistors," *J. Vac. Sci. Technol., B* 13(6) (Nov./Dec. 1995) pp. 2892–2896.

Langdo et al., (2002) "Preparation of Novel SiGe–free Strained Si on Insulator Substrates" *IEEE International SOI Conference*, pp. 211–212 (XP002263057).

Larson, "Integrated Circuit Technology Options for RFIC's—Present Status and Future Directions", *IEEE Journal of Solid–State Circuits*, vol. 33, No. 3, Mar. 1998, pp. 387–399.

Lee et al., "CMOS RF Integrated Circuits at 5 GHz and Beyond", *Proceedings of the IEEE*, vol. 88, No. 10 (Oct. 2000) pp. 1560–1571.

Lee et al., "Strained Ge channel p–type metal–oxide–semiconductor field–effect transistors grown on $Si_{1-x}Ge_x$/Si virtual substrates," *Applied Physics Letters*, vol. 79, No. 20 (Nov. 12, 2001) pp. 3344–3346.

Lee et al., "Strained Ge channel p–type MOSFETs fabricated on $Si_{1-x}Ge_x$/Si virtual substrates," *Mat. Res. Soc. Symp. Proc.*, vol. 686 (2002) pp. A1.9.1–A1.9.5.

Leitz et al., "Channel Engineering of SiGe–Based Heterostructures for High Mobility MOSFETs," *Mat. Res. Soc. Symp. Proc.*, vol. 686 (2002) pp. A3.10.1–A3.10.6.

Leitz et al., "Dislocation glide and blocking kinetics in compositionally graded SiGe/Si," *Journal of Applied Physics*, vol. 90, No. 6 (Sep. 15, 2001) pp. 2730–2736.

Leitz et al., "Hole mobility enhancements in strained $Si/Si_{1-y}Ge_y$ p–type metal–oxide–semiconductor field–effect transistors grown on relaxed $Si_{1-x}Ge_x$ (X<y) virtual substrates," *Applied Physics Letters*, vol. 79, No. 25 (Dec. 17, 2001) pp. 4246–4248.

Li et al., "Design of high speed Si/SiGe heterojunction complementary metal–oxide–semiconductor field effect transistors with reduced short–channel effects," *J. Vac. Sci. Technol.*, vol. 20 No. 3 (May/Jun. 2002) pp. 1030–1033.

Lu et al., "High Performance 0.1 $\mu$m Gate–Length P–Type SiGe MODFET's and MOS–MODFET's", *IEEE Transactions on Electron Devices*, vol. 47, No. 8 (Aug. 2000) pp. 1645–1652.

Maiti et al., "Strained–Si heterostructure field effect transistors,"*Semicond. Sci. Technol.*, vol. 13 (1998) pp. 1225–1246.

Maszara, "Silicon–On–Insulator by Wafer Bonding: A Review," *Journal of the Electrochemical Society*, No. 1 (Jan. 1991) pp. 341–347.

Meyerson et al., "Cooperative Growth Phenomena in Silicon/Germanium Low–Temperature Epitaxy," *Applied Physics Letters*, vol. 53, No. 25 (Dec. 19, 1988) pp. 2555–2557.

Mizuno et al., "Advanced SOI–MOSFETs with Strained–Si Channel for High Speed CMOS–Electron/Hole Mobility Enhancement, " 2000 Symposium on VLSI Technology, Digest of Technical Papers, Honolulu, (Jun. 13–15), IEEE New York, NY, pp. 210–211.

Mizuno et al., "Electron and Hold Mobility Enhancement in Strained–Si MOSFET's on SiGe–on–Insulator Substrates Fabricated by SIMOX Technology," *IEEE Electron Device Letters*, vol. 21, No. 5 (May 2000) pp. 230–232.

Mizuno et al., "High Performance Strained–Si p–MOSFETs on SiGe–on–Insulator Substrates Fabricated by SIMOX Technology," *IEEE IDEM Technical Digest* (1999) pp. 934–936.

Nayak et al., "High–Mobility Strained–Si PMOSFET's"; *IEEE Transactions on Electron Devices*, vol. 43, No. 10 (Oct. 1996) pp. 1709–1716.

O'Neill et al., "SiGe Virtual substrate N–channel heterojunction MOSFETS," *Semicond. Sci. Technol.*, vol. 14 (1999) pp. 784–789.

Ota, Y. et al., "Application of heterojunction FET to power amplifier for cellular telephone," *Electronics Letters*, vol. 30 No. 11 (May 26, 1994) pp. 906–907.

Papananos, "Low Noise Amplifiers in MOS Technologies," and "Low Noise Tuned–LC Oscillator," *Radio–Frequency Microelectronic Circuits for Telecommunication Applications* (1999) pp. 115–117, 188–193.

Parker et al., "SiGe heterostructure CMOS circuits and applications," *Solid State Electronics*, vol. 43 (1999) pp. 1497–1506.

Batterman, "Hillocks, Pits, and Etch Rate in Germanium Crystals," *Journal of Applied Physics*, vol. 28, No. 11 (Nov., 1957), pp. 1236–1241.

Bohg, "Ethylene Diamine–Pyrocatechol–Water Mixture Shows Etching Anomaly in Boron–Doped Silicon," *Journal of the Electrochemical Society*, vol. 118, No. 2 (Feb. 1971), pp. 401–402.

Brunner et al., "Molecular beam epitaxy growth and thermal stability of $Si_{1-x}Ge_x$ layers on extremely thin silicon–on–insulator substrates," *Thin Solid Films*, vol. 321 (1998), pp. 245–250.

Chen et al., "The Band Model and the Etching Mechanism of Silicon in Aqueous KOH," *Journal of the Electrochemical Society*, vol. 142, No. 1 (Jan. 1995), pp. 170–176.

Desmond et al., "The Effects of Process–Induced Defects on the Chemical Selectivity of Highly Doped Boron Etch Stops in Silicon," *Journal of the Electrochemical Society*, vol. 141, No. 1 (Jan. 1994), pp. 178–184.

Ehman et al., "Morphology of Etch Pits on Germanium Studied by Optical and Scanning Electron Microscopy," *Journal of Applied Physics*, vol. 41, No. 7 (Jun. 1970), pp. 2824–2827.

Feijóo et al., "Etch Stop Barriers in Silicon Produced by Ion Implantation of Electrically Non–Active Species," *Journal of the Electrochemical Society*, vol. 139, No. 8 (Aug. 1992), pp. 2309–2313.

Finne et al., "A Water–Amine–Complexing Agent System for Etching Silicon," *Journal of the Electrochemical Society*, vol. 114, No. 9 (Sep. 1967), pp. 965–970.

Fitzgerald, "GeSi/Si Nanostructures," *Annual Review of Materials Science*, vol. 25 (1995), pp. 417–454.

Frank, "Orientation–Dependent Dissolution of Germanium," *Journal of Applied Physics*, vol. 31, No. 11 (Nov. 1960), pp. 1996–1999.

Fukatsu, "SiGe–based semiconductor–on–insulator substrate created by low–energy separation–by–implanted–oxygen," *Applied Physics Letters*, vol. 72, No. 26 (Jun. 29, 1998), pp. 3485–3487.

Ghandi et al., "Chemical Etching of Germanium," *Journal of the Electrochemical Society*, vol. 135, No. 8, (Aug. 1988), pp. 2053–2054.

Godbey et al., "A $Si_{0.7}Ge_{0.3}$ strained–layer etch stop for the generation of thin layer undoped silicon," *Applied Physics Letters*, vol. 56, No. 4 (Jan. 22, 1990), pp. 373–375.

Herzog et al., "X–Ray Investigation of Boron–and Germanium–Doped Silicon Epitaxial Layers," *Journal of the Electrochemical Society*, vol. 131, No. 12 (Dec. 1984), pp. 2969–2974.

Holmes, "The Orientation Dependence of Etching Effects on Germanium Crystals," *Acta Metallurgica*, vol. 7, No. 4 (Apr. 1959), pp. 283–290.

Huang et al., "The Impact of Scaling Down to Deep Submicron on CMOS RF Circuits," *IEEE Journal of Solid State Circuits*, vol. 33, No. 7 (Jul. 1998), pp. 1023–1036.

Hunt et al., "Highly Selective Etch Stop by Stress Compensation for Thin–Film BESOI," *1990 IEEE/SOI Technology Conference*, (Oct. 2–4, 1990), pp. 145–146.

Jaccodine, "Use of Modified Free Energy Theorems to Predict Equilibrium Growing and Etching Shapes," *Journal of Applied Physics*, vol. 33, No. 8 (Aug. 1962), pp. 2643–2647.

Kern, "Chemical Etching of Silicon, Germanium, Gallium, Arsenide, and Gallium Phosphide," *RCA Review*, vol. 39 (Jun. 1978), pp. 278–308.

Lang et al., "Bulk Micromachining of Ge for 1R Gratings," *Journal of Micromechanics and Microengineering*, vol. 6, No. 1 (Mar. 1996), pp. 46–48.

Leancu et al., "Anisotropic Etching of Germanium," *Sensors and Actuators*, A46–47 (1995), pp. 35–37.

LeGoues et al., "Relaxation of SiGe thin films grown on $Si/SiO_2$ substrates," *Applied Physics Letters*, vol. 75, No. 11 (Jun. 1, 1994), pp. 7240–7246.

Lehmann et al., "Implanted Carbon: An Effective Etch–Stop in Silicon," *Journal of the Electrochemical Society*, vol. 138, No. 5 (May 1991), pp. 3–4.

Narozny et al., "Si/SiGe Heterojunction Bipolar Transistor with Graded GAP SiGe Base Made by Molecular Beam Epitaxy," *IEEE IEDM* (1988), pp. 562–565.

Palik et al., "Ellipsometric Study of the Etch–Stop Mechanism in Heavily Doped Silicon," *Journal of the Electrochemical Society*, vol. 132, No. 1 (Jan. 1985), pp. 135–141.

Palik et al., "Study of Bias–Dependent Etching of Si in Aqueous KOH," *Journal of the Electrochemical Society*, vol. 134, No. 2 (Feb. 1987), pp. 404–409.

Palik et al., "Study of the Etch–Stop Mechanisms in Silicon," *Journal of the Electrochemical Society*, vol. 129, No. 9 (Sep. 1982), pp. 2051–2059.

Petersen, "Silicon as a Mechanical Material," *Proceedings of the IEEE*, vol. 70, No. 5 (May 1982), pp. 420–457.

Powell et al., "New approach to the growth of low dislocation relaxed SiGe material," *Applied Physics Letters*, vol. 64, No. 14 (Apr. 4, 1994), pp. 1865–1858.

Rai–Choudhury et al., "Doping of Epitaxial Silicon," *Journal of Crystal Growth*, vol. 7 (1970), pp. 361–367.

Raley et al., "(100) Silicon Etch–Rate Dependence on Boron Concentration in Ethylenediamine–Pyrocatechol–Water Solutions," *Journal of the Electrochemical Society*, vol. 131, No. 1 (Jan. 1984), pp. 161–170.

Seidel et al., "Anisotropic Etching of Crystalline Silicon in Alkaline Solutions," *Journal of the Electrochemical Society*, vol. 137, No. 11 (Nov. 1990), pp. 3626–3632.

Senna et al., "Gallium Doping for Silicon Etch Stop in KOH," *Transducers '95/Eurosensors IX*, the 8th International Conference on Solid–State Sensors and Actuators and Eurosensors IX, Stockholm, Sweden, Jun. 25–29, 1995, pp. 194–195.

Shang et al., "The Development of an Anisotropic Si Etch Process Selective to $Ge_xSi_{1-x}$ Underlayers," *Journal of the Electrochemical Society.*, vol. 141, No. 2 (Feb. 1994), pp. 507–510.

Soderbarg, "Fabrication of BESOI–Materials Using Implanted Nitrogen as an Effective Etch Stop Barrier," *1989 IEEE SOS/SOI Technology Conference*, (Oct. 3–5, 1989), p. 64.

Sundaram et al., "Electrochemical etching of Silicon by Hydrazine," *Journal of the Electrochemical Society*, vol. 140, No. 6 (Jun. 1993), pp. 1592–1597.

Sze, "Physics of Semiconductor Devices," (1991).

Takagi et al., "On the Universality of Inversion Layer Mobility in Si MOSFET's: Part I–Effects of Substrate Impurity Concentration," *IEEE Transactions on Electron Devices*, vol. 41, No. 12 (Dec. 1994), pp. 2357–2362.

Ting et al., "Monolithic Integration of III–V Materials and Devices on Silicon," Part of the0 SPIE Conference on Silicon–Based Optoelectronics, San Jose, CA, (Jan. 1999), pp. 19–28.

Vol'fson et al., "Fundamental Absorption Edge of Silicon Heavily Doped with Donor or Acceptor Impurities," *Soviet Physics Semiconductors*, vol. 1, No. 3 (Sep. 1967), pp. 327–332.

Wu, "Novel Etch–Stop Materials for Silicon Micromachining," Thesis Submitted to the Massachusetts Institute of Technology Department of Materials Science and Engineering on May 9, 1997, pp. 1–62.

Yi et al., "$Si_{1-x}Ge_x$/Si Multiple Quantum Well Wires Fabricated Using Selective Etching," *Materials Research Society Symposium Proceedings*, vol. 379 (1995), pp. 91–96.

Ransom et al., "Gate–Self–Aligned n–channel and p–channel Germanium MOSFET's," *IEEE Transactions on Electron Devices*, vol. 38, No. 12 (Dec. 1991) p. 2695.

Reinking et al., "Fabrication of high–mobility Ge p–channel MOSFET's on Si substrates," *Electronics Letters*, vol. 35, No. 6 (Mar. 18, 1999), pp. 503–504.

Rim et al., "Enhanced Hole Mobilities in Surface–channel Strained–Si p–MOSFETs"; *IEDM*, 1995, pp. 517–520.

Rim et al., "Fabrication and Analysis of Deep Submicron Strained–Si N–MOSFET's"; *IEEE Transactions on Electron Devices*, vol. 47, No. 7 (Jul. 2000) pp. 1406–1415.

Rim, "Application of Silicon–Based Heterostructures to Enhanced Mobility Metal–Oxide–Semiconductor Field–Effect Transistor", Ph.D. Thesis, Stanford University (1999) pp. 1–184.

Robbins et al., "A model for heterogeneous growth of $Si_{1-x}Ge_x$ films for hydrides," *Journal of Applied Physics*, vol. 69, No. 6 (Mar. 15, 1991) pp. 3729–3732.

Sadek et al., "Design of Si/SiGe Heterojunction Complementary Metal–Oxide–Semiconductor Transistors," *IEEE Trans. Electron Devices* (Aug. 1996) pp. 1224–1232.

Sakaguchi et al., "ELTRAN® by Splitting Porous Si Layers," Proc. 195th Int. SOI Symposium, vol. 99–3, *Electrochemical Society* (1999) pp. 117–121.

Schäffler, "High–Mobility Si and Ge Structures," *Semiconductor Science and Technology*, vol. 12 (1997) pp. 1515–1549.

Sugimoto et al., "A 2V, 500 MHz and 3V, 920 MHz Low–Power Current–Mode 0.6 $\mu$m CMOS VCO Circuit", *IEICE Trans. Electron.*, vol E82–C, No. 7 (Jul. 1999) pp. 1327–1329.

Ternent et al., "Metal Gate Strained Silicon MOSFET's for Microwave Integrated Circuits", *IEEE* (Oct. 2000) pp. 38–43.

Tsang et al., "Measurements of alloy composition and strain in thin $Ge_xSi_{1-x}$ layers," *J. Appl. Phys.*, vol. 75, No. 12 (Jun. 15, 1994) pp. 8098–8108.

Tweet et al., "Factors determining the composition of strained GeSi layers grown with disilane and germane," *Applied Physics Letters*, vol. 65, No. 20 (Nov. 14, 1994) pp. 2579–2581.

Usami et al., "Spectroscopic study of Si–based quantum wells with neighboring confinement structure," *Semicon Sci. Technol.* (1997) (abstract).

Welser et al., "Electron Mobility Enhancement in Strained–Si N–Type Metal–Oxide–Semiconductor Field––Effect Transistors," *IEEE Electron Device Letters*, vol. 15, No. 3 (Mar. 1994) pp. 100–102.

Welser et al., "Evidence of Real–Space Hot–Electron Transfer in High Mobility, Strained–Si Multilayer MOSFETs," *IEEE IDEM Technical Digest* (1993) pp. 545–548.

Welser et al., "NMOS and PMOS Transistors Fabricated in Strained Silicon/Relaxed Silicon–Germanium Structures," *IEEE IDEM Technical Digest* (1992) pp. 1000–1002.

Welser, "The Application of Strained Silicon/Relaxed Silicon Germanium Heterostructures to Metal–Oxide–Semiconductor Field–Effect Transistors," Ph.D. Thesis, Stanford University (1994) pp. 1–205.

Wolf et al., "Silicon Processing for the VLSI Era," vol. 1 *Process Technology* (1986) pp. 384–386.

Xie et al., "Semiconductor Surface Roughness: Dependence on Sign and Magnitude of Bulk Strain," *The Physical Review Letters*, vol. 73, No. 22 (Nov. 28, 1994) pp. 3006–3009.

Xie et al., "Very high mobility two–dimensional hole gas in Si/ $Ge_xSi_{1-x}$/Ge structures grown by molecular beam epitaxy," *Appl. Phys. Lett.*, vol. 63, No. 16 (Oct. 18, 1993) pp. 2263–2264.

Xie, "SiGe Field effect transistors," *Materials Science and Engineering*, vol. 25 (1999) pp. 89–121.

Yamagata et al., "Bonding, Splitting and Thinning by Porous Si in ELTRAN®; SOI–Epi Wafer©," *Mat. Res. Soc. Symp. Proc.*, vol. 681E (2001) pp. 18.2.1–18.2.10.

Yeo et al., "Nanoscale Ultra–Thin–Body Silicon–on–Insulator P–MOSFET with a SiGe/Si Heterostructure Channel," *IEEE Electron Device Letters*, vol. 21, No. 4 (Apr. 2000) pp. 161–163.

Zhang et al., "Demonstration of a GaAs–Based Compliant Substrate Using Wafer Bonding and Substrate Removal Techniques," Electronic Materials and Processing Research Laboratory, Department of Electrical Engineering, University Park, PA 16802 (1998) pp. 25–28.

* cited by examiner

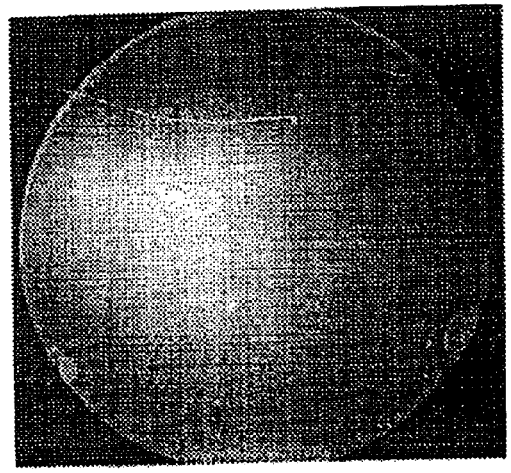 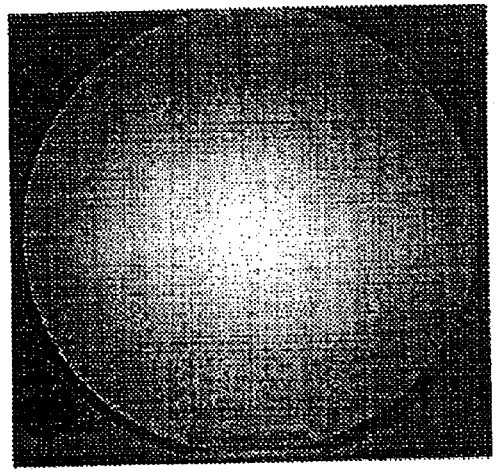
*FIG. 2A*  *FIG. 2B*

PROCESS FOR PRODUCING SEMICONDUCTOR ARTICLE USING GRADED EPITAXIAL GROWTH

PRIORITY INFORMATION

This application is a continuation of application Ser. No. 10/384,160, filed Mar. 7, 2003, now U.S. Pat. No. 6,737,670 that is a divisional of application Ser. No. 09/928,126, filed on Aug. 10, 2001, issued as U.S. Pat. No. 6,573,126 on Jun. 3, 2003, which claims priority from provisional application Ser. No. 60/225,666, filed Aug. 16, 2000, now expired, the entire disclosures of which are incorporated by reference herein.

BACKGROUND OF THE INVENTION

The present invention relates to a production of a general substrate of relaxed $Si_{1-x}Ge_x$-on-insulator (SGOI) for various electronics or optoelectronics applications, and the production of monocrystalline III-V or II-VI material-on-insulator substrate.

Relaxed $Si_{1-x}Ge_x$-on-insulator (SGOI) is a very promising technology as it combines the benefits of two advanced technologies: the conventional SOI technology and the disruptive SiGe technology. The SOI configuration offers various advantages associated with the insulating substrate, namely reduced parasitic capacitances, improved isolation, reduced short-channel-effect, etc. High mobility strained-Si, strained-$Si_{1-x}Ge_x$ or strained-Ge MOS devices can be made on SGOI substrates.

Other III-V optoelectronic devices can also be integrated into the SGOI substrate by matching the lattice constants of III-V materials and the relaxed $Si_{1-x}Ge_x$. For example a GaAs layer can be grown on $Si_{1-x}Ge_x$-on-insulator where x is equal or close to 1. SGOI may serve as an ultimate platform for high speed, low power electronic and optoelectronic applications.

SGOI has been fabricated by several methods in the prior art. In one method, the separation by implantation of oxygen (SIMOX) technology is used to produce SGOI. High dose oxygen implant was used to bury high concentrations of oxygen in a $Si_{1-x}Ge_x$ layer, which was then converted into a buried oxide (BOX) layer upon annealing at high temperature (for example, 1350° C.). See, for example, Mizuno et al. IEEE Electron Device Letters, Vol. 21, No. 5, pp. 230–232, 2000 and Ishilawa et al. Applied Physics Letters, Vol. 75, No. 7, pp. 983–985, 1999. One of the main drawbacks is the quality of the resulting $Si_{1-x}Ge_x$ film and BOX. In addition, Ge segregation during high temperature anneal also limits the maximum Ge composition to a low value.

U.S. Pat. Nos. 5,461,243 and 5,759,898 describe a second method, in which a conventional silicon-on-insulator (SOI) substrate was used as a compliant substrate. In the process, an initially strained $Si_{1-x}Ge_x$ layer was deposited on a thin SOI substrate. Upon an anneal treatment, the strain was transferred to the thin silicon film underneath, resulting in relaxation of the top $Si_{1-x}Ge_x$ film. The final structure is relaxed-SiGe/strained-Si/insulator, which is not an ideal SGOI structure. The silicon layer in the structure is unnecessary, and may complicate or undermine the performance of devices built on it. For example, it may form a parasitic back channel on this strained-Si, or may confine unwanted electrons due to the band gap offset between the strained-Si and SiGe layer.

U.S. Pat. Nos. 5,906,951 and 6,059,895 describe the formation of a similar SGOI structure: strained-layer(s)/relaxed-SiGe/Si/insulator structure. The structure was produced by wafer bonding and etch back process using a $P^{++}$ layer as an etch stop. The presence of the silicon layer in the above structure may be for the purpose of facilitating Si-insulator wafer bonding, but is unnecessary for ideal SGOI substrates. Again, the silicon layer may also complicate or undermine the performance of devices built on it. For example, it may form a parasitic back channel on this strained-Si, or may confine unwanted electrons due to the band gap offset between the strained-Si and SiGe layer. Moreover, the etch stop of $P^{++}$ in the above structure is not practical when the first graded $Si_{1-y}Ge_y$ layer described in the patents has a y value of larger than 0.2. Experiments from research shows $Si_{1-y}Ge_y$ with y larger than 0.2 is a very good etch stop for both KOH and TMAH, as described in a published PCT application WO 99/53539. Therefore, the KOH will not be able to remove the first graded $Si_{1-y}Ge_y$ layer and the second relaxed SiGe layer as described in the patents.

Other attempts include re-crystallization of an amorphous $Si_{1-x}Ge_x$ layer deposited on the top of SOI (silicon-on-insulator) substrate, which is again not an ideal SGOI substrate and the silicon layer is unnecessary, and may complicate or undermine the performance of devices built on it. Note Yeo et al. IEEE Electron Device Letters, Vol. 21, No. 4, pp. 161–163, 2000. The relaxation of the resultant SiGe film and quality of the resulting structure are main concerns.

From the above, there is a need for a simple technique for relaxed SGOI substrate production, a need for a technique for production of high quality SGOI and other III-V material-on-insulator, and a need for a technique for wide range of material transfer.

SUMMARY OF THE INVENTION

According to the invention, there is provided an improved technique for production of wide range of high quality material is provided. In particular, the production of relaxed $Si_{1-x}Ge_x$-on-insulator (SGOI) substrate or relaxed III-V or II-VI material-on-insulator, such as GaAs-on-insulator, is described. High quality monocrystalline relaxed SiGe layer, relaxed Ge layer, or other relaxed III-V material layer is grown on a silicon substrate using a graded $Si_{1-x}Ge_x$ epitaxial growth technique. A thin film of the layer is transferred into an oxidized handle wafer by wafer bonding and wafer splitting using hydrogen ion implantation. The invention makes use of the graded $Si_{1-x}Ge_x$ buffer structure, resulting in a simplified and improved process.

The invention also provides a method allowing a wide range of device materials to be integrated into the inexpensive silicon substrate. For example, it allows production of $Si_{1-x}Ge_x$-on-insulator with wide range of Ge concentration, and allows production of many III-V or II-VI materials on insulator like GaAs, AlAs, ZnSe and InGaP. The use of graded $Si_{1-x}Ge_x$ buffer in the invention allows high quality materials with limited dislocation defects to be produced and transferred. In one example, SGOI is produced using a SiGe structure in which a region in the graded buffer can act as a natural etch stop.

The invention provides a process and method for producing monocrystalline semiconductor layers. In an exemplary embodiment, a graded $Si_{1-x}Ge_x$ (x increases from 0 to y) is deposited on a first silicon substrate, followed by deposition of a relaxed $Si_{1-y}Ge_y$ layer, a thin strained $Si_{1-z}Ge_z$ layer and another relaxed $Si_{1-y}Ge_y$ layer. Hydrogen ions are then introduced into the strained $Si_{1-z}Ge_z$ layer. The relaxed $Si_{1-y}Ge_y$ layer is bonded to a second oxidized substrate. An annealing treatment splits the bonded pair at the strained Si layer, whereby the second relaxed $Si_{1-y}Ge_y$ layer remains on said second substrate.

In another exemplary embodiment, a graded $Si_{1-x}Ge_x$ is deposited on a first silicon substrate, where the Ge concentration x is increased from 0 to 1. Then a relaxed GaAs layer is deposited on the relaxed Ge buffer. As the lattice constant of GaAs is close to that of Ge, GaAs has high quality with limited dislocation defects. Hydrogen ions are introduced into the relaxed GaAs layer at the selected depth. The relaxed GaAs layer is bonded to a second oxidized substrate. An annealing treatment splits the bonded pair at the hydrogen ion rich layer, whereby the upper portion of relaxed GaAs layer remains on said second substrate.

BRIEF DESCRIPTION OF THE DRAWINGS

FIGS. 2A and 2B are infrared transmission images of an as-bonded wafer pair and a final SGOI substrate after splitting, respectively;

DETAILED DESCRIPTION OF THE INVENTION

Figure 1A:
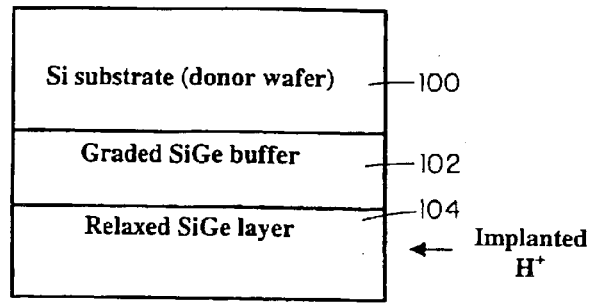
FIGS. 1A–1C are block diagrams showing the process of producing a SGOI substrate in accordance with the invention.

An example of a process in which SGOI is created by layer transfer is described. The experiment was performed in two stages. In the first stage, heteroepitaxial SiGe layers are formed by a graded epitaxial growth technology. Starting with a 4-inch Si (100) donor wafer 100, a linearly stepwise compositionally graded $Si_{1-x}Ge_x$ buffer 102 is deposited with CVD, by increasing Ge concentration from zero to 25%. Then a 2.5 $\mu$m relaxed $Si_{0.75}Ge_{0.25}$ cap layer 104 is deposited with the final Ge composition, as shown in FIG. 1A.

Figure 1B:
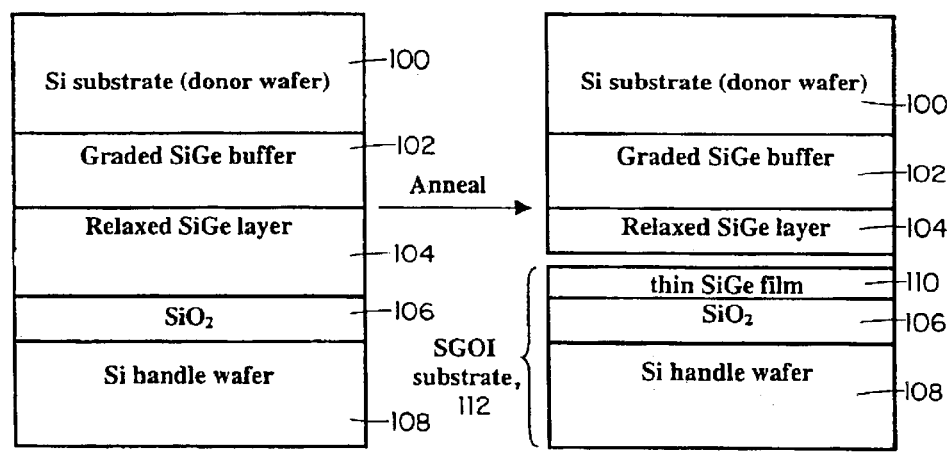

The relaxed SiGe cap layer has high quality with very low dislocation defect density (less than $1E6/cm^2$), as the graded buffer accommodates the lattice mismatch between Si and relaxed SiGe. A thin layer of this high quality SiGe will be transferred into the final SGOI structure. The surface of the as-grown relaxed SiGe layer shows a high roughness around 11 nm to 15 nm due to the underlying strain fields generated by misfit dislocations at the graded layer interfaces and thus chemical-mechanical polishing (CMP) is used to smooth the surface. In the second stage, the donor wafer is implanted with hydrogen ion (100 keV, $5E16$ $H^+/cm^2$) to form a buried hydrogen-rich layer. After a surface clean step in a modified RCA solution, it is bonded to an oxidized 106 Si handle wafer 108 at room temperature as shown in FIG. 1B.

The wafer bonding is one of the key steps, and the bonding energy should be strong enough in order to sustain the subsequent layer transfer in the next step. Good bonding requires a flat surface and a highly hydrophilic surface before bonding. On the other hand, the buried oxide in the final bonded structure is also required to have good electrical properties as it will influence the final device fabricated on it. In the conventional Si film transfer, thermal oxide on the donor wafer is commonly used before $H^+$ implantation and wafer bonding, which becomes the buried oxide in the resulting silicon-on-insulator structure.

The thermal oxide of the Si donor wafer meets all the requirements, as it has good electrical properties, has flat surface and bonds very well to the handle wafer. Unlike the Si, however, the oxidation of SiGe film results in poor thermal oxide quality, and the Ge segregation during oxidation also degrades the SiGe film. Therefore the thermal oxide of SiGe is not suitable for the SGOI fabrication. In one exemplary experiment the SiGe film will be directly bonded to an oxidized Si handle wafer. The high quality thermal oxide in the handle wafer will become the buried oxide in the final SGOI structure.

Having a flat surface after a CMP step, the SiGe wafer went through a clean step. Compared to Si, one difficulty of SiGe film is that, SiGe surface becomes rougher during the standard RCA clean, as the $NH_4OH$ in RCA1 solution etches Ge faster than Si. Rough surface will lead to weak bonding as the contact area is reduced when bonded to the handle wafer. In this exemplary embodiment, $H_2SO_4$—$H_2O_2$ solution is used in the place of RCA1, which also meets the clean process requirement for the subsequent furnace annealing after bonding. The SiGe surface after $H_2SO_4$—$H_2O_2$ clean shows better surface roughness compared to RCA1.

Figure 1C:
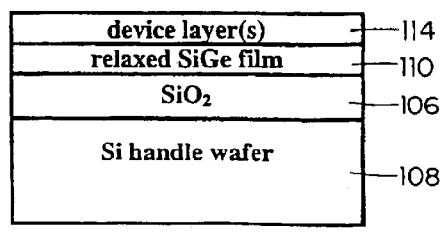

After this modified clean procedure, the SiGe wafer is dipped in the diluted HF solution to remove the old native oxide. It is then rinsed in DI water thoroughly to make the surface hydrophilic by forming a fresh new native oxide layer that is highly active. After spinning dry, the SiGe wafer is bonded to an oxidized handle wafer at room temperature, and then annealed at 600° C. for 3 hours. During anneal the bonded pair split into two sheets along the buried hydrogen-rich layer, and a thin relaxed $Si_{0.75}Ge_{0.25}$ film 110 is transferred into the handle wafer, resulting in a SGOI substrate 112, as shown in FIG. 1B. A final 850° C. anneal improves the $Si_{0.75}Ge_{0.25}/SiO_2$ bond. Thereafter, device layers 114 can be processed on the SGOI substrate 112 as shown in FIG. 1C.

Figure 3:
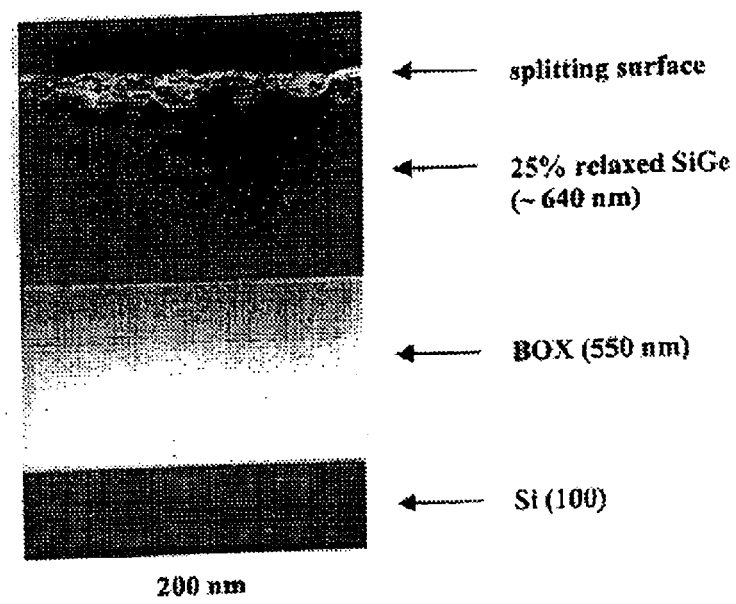
FIG. 3 is a TEM cross-section view of a SiGe layer that was transferred onto the top of a buried oxide.

FIGS. 2A and 2B are infrared transmission images of the as-bonded wafer pair and the final SGOI substrate after splitting, respectively. To investigate the surface of the as-transferred SGOI substrate, transmission electron microscopy (TEM) and atomic force microscopy (AFM) were used. The TEM cross-section view in FIG. 3 shows a ~640 nm SiGe layer was transferred onto the top of a 550 nm buried oxide (BOX). Surface damage is also shown clearly at the splitting surface with a damage depth of ~100 nm.

Figure 4:
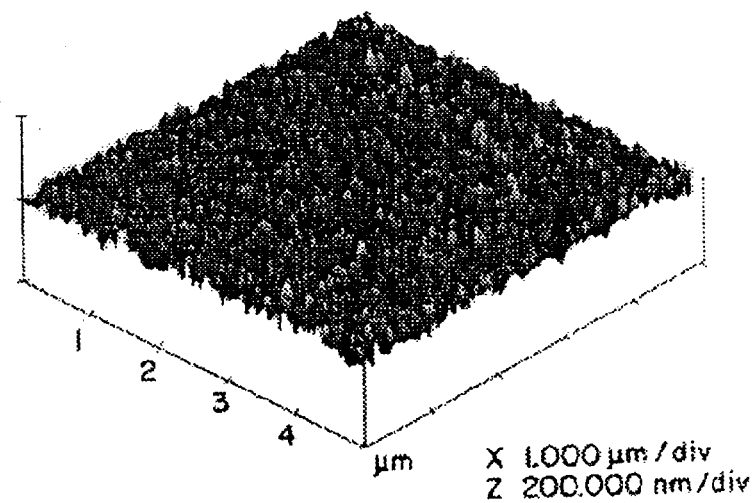
FIG. 4 is an AFM for a transferred SGOI substrate showing surface roughness.

FIG. 4 shows a surface roughness of 11.3 nm in an area of 5×5 $\mu m^2$ by AFM for the as-transferred SGOI. The data is similar to those from as-transferred silicon film by smart-cut process, and suggests that a top layer of about 100 nm should be removed by a final CMP step. After SiGe film transferring, only a thin relaxed SiGe film is removed and the donor wafer can be used again for a donor wafer. Starting from this general SGOI substrate, various device structures can be realized by growing one or more device layers on the top, as shown in FIG. 2C. Electrical evaluation is in progress by growing a strain Si layer on the top of this SGOI substrate followed by fabrication of strained Si channel devices.

Bond strength is important to the process of the invention. AFM measurements were conducted to investigate the SiGe film surface roughness before bonding under different conditions. One experiment is designed to investigate how long the SiGe surface should be polished to have smooth surface and good bond strength, since the surface of the as-grown relaxed SiGe layer has a high roughness around 11 nm to 15 nm. Several identical 4-inch Si wafers with relaxed $Si_{0.75}Ge_{0.25}$ films were CMPed with optimized polishing conditions for different times. Using AFM, the measured surface mircoroughness RMS at an area of 10 μm×10 μm is 5.5 Å, 4.5Å and 3.8 Å, for wafer CMPed for 2 min., 4 min. and 6 min. respectively. After bonding to identical handle wafers, the tested bond strength increases with decreasing RMS. A CMP time of 6 min. is necessary for good strength.

In another experiment, two identical 4-inch Si wafers with relaxed $Si_{0.75}Ge_{0.25}$ films were CMPed for 8 min. After two cleaning steps in $H_2SO_4$:$H_2O_2$ solution and one step in diluted HF solution, one wafer was put in a new $H_2SO_4$:$H_2O_2$ (3:1) solution and another in a new $NH_4OH$:$H_2O_2$:$H_2O$ (1:1:5), i.e. the conventional RCA1 solution, both for 15 min. The resultant wafers were tested using AFM. The wafer after $H_2SO_4$:$H_2O_2$ solution shows a surface roughness RMS of 2 Å at an area of 1 μm×1 μm, which after $NH_4OH$:$H_2O_2$:$H_2O$ shows 4.4 Å. Clearly, the conventional RCA clean roughens the SiGe surface significantly, and $H_2SO_4$:$H_2O_2$ should be used for SiGe clean.

In yet another experiment, the clean procedure is optimized before bonding. For direct SiGe wafer to oxidized handle wafer bonding (SiGe-oxide bonding), several different clean procedures were tested. It has been found that the $H_2SO_4$:$H_2O_2$ (2~4:1) solution followed by DI water rinse and spin dry gives good bond strength. Alternatively, one can also deposit an oxide layer on the SiGe wafer and then CMP the oxide layer. In this case SiGe/oxide is bonded to an oxidized handle wafer, i.e. oxide-oxide bonding. Among different clean procedures, it was found that $NH_4OH$:$H_2O_2$:$H_2O$ clean and DI water rinse following by diluted HF, DI water rinse and spin dry gives very good bond strength.

Figure 5:
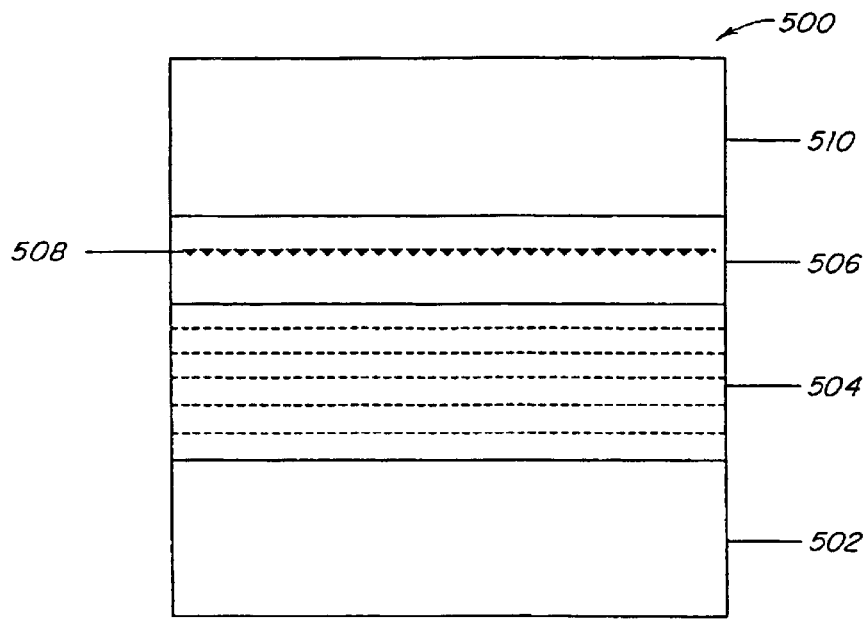
FIGS. 5–8 are block diagrams of various exemplary embodiments semiconductor structures in accordance with the invention.

FIG. 5 is a block diagram of an exemplary embodiment of a semiconductor structure 500 in accordance with the invention. A graded $Si_{1-x}Ge_x$ buffer layer 504 is grown on a silicon substrate 502, where the Ge concentration x is increased from zero to a value y in a stepwise manner, and y has a selected value between 0 and 1. A second relaxed $Si_{1-y}Ge_y$ layer 506 is then deposited, and hydrogen ions are implanted into this layer with a selected depth by adjusting implantation energy, forming a buried hydrogen-rich layer 508. The wafer is cleaned and bonded to an oxidized handle wafer 510. An anneal treatment at 500~600° C. splits the bonded pair at the hydrogen-rich layer 508. As a result, the upper portion of the relaxed $Si_{1-y}Ge_y$ layer 506 remains on the oxidized handle wafer, forming a SGOI substrate. The above description also includes production of Ge-on-insulator where y=1.

During the wafer clean step prior to bonding, the standard RCA clean for the silicon surface is modified. Since the $NH_4OH$ in standard RCA1 solution etches Ge faster than Si, the SiGe surface will become rough, leading to a weak bond. A $H_2SO_4$—$H_2O_2$ solution is used in the place of RCA1, which also meets the clean process requirement for the subsequent furnace annealing after bonding. The SiGe surface after the $H_2SO_4$—$H_2O_2$ clean showed better surface roughness compared to RCA1. After the modified RCA clean, the wafers are then immersed in another fresh $H_2SO_4$—$H_2O_2$ solution for 10 to 20 min. $H_2SO_4$—$H_2O_2$ renders the SiGe surface hydrophilic. After a rinse in DI wafer and spin drying, the SiGe wafer is bonded to an oxidized handle wafer at room temperature immediately, and then annealed at 500~600° C. for wafer splitting.

Figure 6:
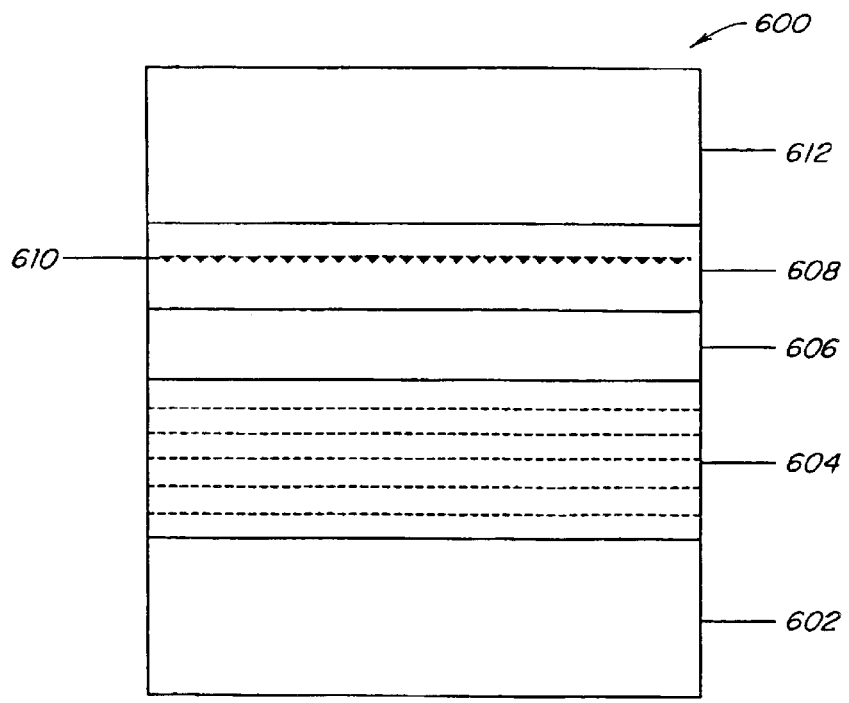

FIG. 6 is a block diagram of another exemplary embodiment of a semiconductor structure 600. The structure 600 includes a graded $Si_{1-x}Ge_x$ buffer layer 604 grown on a silicon substrate 602, where the Ge concentration x is increased from zero to 1. Then a relaxed pure Ge layer 606 and a III-V material layer 608, such as a GaAs layer, are epitaxially grown on the Ge layer. Hydrogen ions are implanted into the GaAs layer 608 with a selected depth by adjusting implantation energy, forming a buried hydrogen-rich layer 610. The wafer is cleaned and bonded to an oxidized handle wafer 612. An anneal treatment splits the bonded pair at the hydrogen-rich layer 610. As a result, the upper portion of the GaAs layer 608 remains on the oxidized handle wafer, forming a GaAs-on-insulator substrate.

Figure 7:
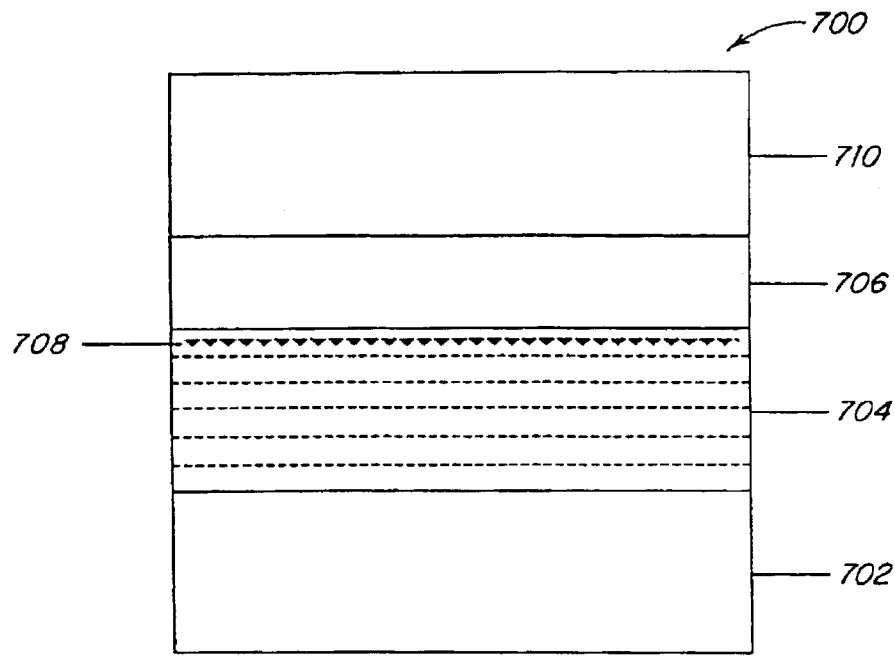

FIG. 7 is a block diagram of yet another exemplary embodiment of a semiconductor structure 700. A graded $Si_{1-x}Ge_x$ buffer layer 704 is grown on a silicon substrate 702, where the Ge concentration x is increased from zero to a selected value y, where is less than 0.2. A second relaxed $Si_{1-z}Ge_z$ layer 706 is deposited, where z is between 0.2 to 0.25. Hydrogen ions are implanted into the graded $Si_{1-x}Ge_x$ buffer layer 704 with a selected depth, forming a buried hydrogen-rich layer 708 within layer 704. The wafer is cleaned and bonded to an oxidized handle wafer 710. An anneal treatment at 500~600° C. splits the bonded pair at the hydrogen-rich layer 708.

As a result, the upper portion of the graded $Si_{1-x}Ge_x$ buffer layer 704 and the relaxed $Si_{1-z}Ge_z$ layer 706 remains on the oxidized handle wafer 710. The remaining graded $Si_{1-x}Ge_x$ buffer layer 704 is then selectively etched by either KOH or TMAH. KOH and TMAH etch $Si_{1-x}Ge_x$ fast when x is less 0.2, but becomes very slow when x is larger than 0.2. Thus, the graded $Si_{1-x}Ge_x$ buffer layer 704 can be etched selectively, leaving the relaxed $Si_{1-z}Ge_z$ layer 706 on the insulating substrate 710 and forming a relaxed SGOI substrate. In this process, the thickness of the relaxed $Si_{1-z}Ge_z$ film 706 on the final SGOI structure is defined by film growth, which is desired in some applications.

Figure 8:
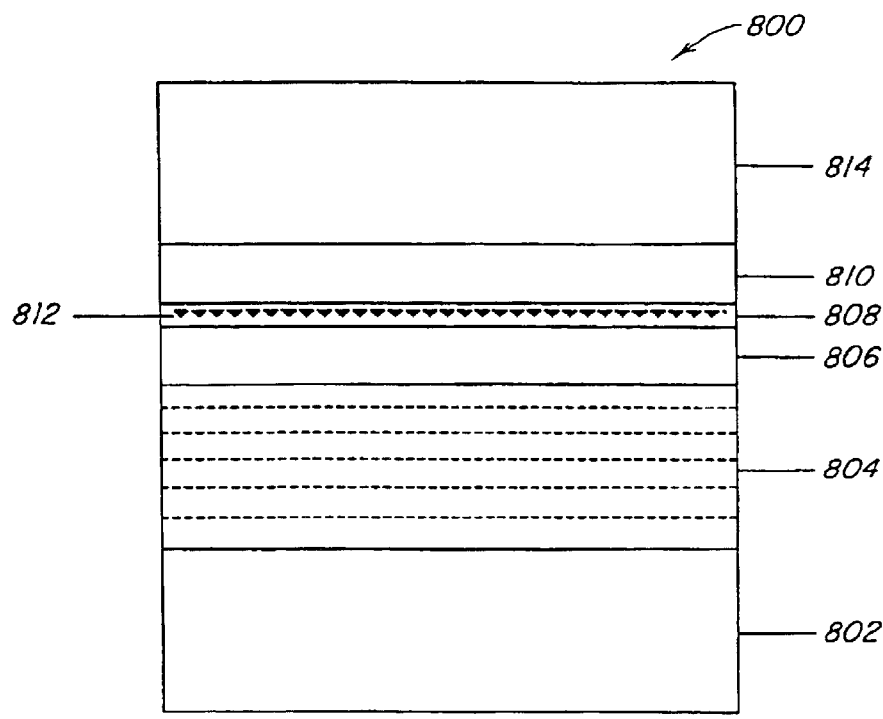

FIG. 8 is a block diagram of yet another exemplary embodiment of a semiconductor structure 800. A graded $Si_{1-x}Ge_x$ buffer layer 804 is grown on a silicon substrate 802, where the Ge concentration x is increased from zero to a selected value y between 0 and 1. A second relaxed $Si_{1-y}Ge_y$ layer 806 is deposited, followed by a strained $Si_{1-z}Ge_z$ layer 808 and another relaxed $Si_{1-y}Ge_y$ layer 810. The thickness of layers 806, 808, and 810, and the value z are chosen such that the $Si_{1-z}Ge_z$ layer 808 is under equilibrium strain state while the $Si_{1-y}Ge_y$ layers 806 and 810 remain relaxed. In one option, hydrogen ions may be introduced into the strained $Si_{1-z}Ge_z$ layer 808, forming a hydrogen-rich layer 812. The wafer is cleaned and bonded to an oxidized handle wafer 814. The bonded pair is then separated along the strained $Si_{1-z}Ge_z$ layer 808.

Since the strain makes the layer weaker, the crack propagates along this layer during separation. The separation can be accomplished by a variety of techniques, for example using a mechanical force or an anneal treatment at 500~600° C. when the hydrogen is also introduced. See, for example, U.S. Pat. Nos. 6,033,974 and 6,184,111, both of which are incorporated herein by reference. As a result, the relaxed $Si_{1-y}Ge_y$ layer 810 remains on the oxidized handle wafer, forming a relaxed SGOI substrate. The thickness of layers 806, 808, and 810, and the value z may also be chosen such that there are a good amount of dislocations present in the $Si_{1-z}Ge_z$ layer 808 while the top $Si_{1-y}Ge_y$ layer 810 remains relaxed and having high quality and limited dislocation defects.

These dislocation defects in the $Si_{1-z}Ge_z$ layer 808 can then act as hydrogen trap centers during the subsequent step of introducing ions. The hydrogen ions may be introduced by various ways, such as ion implantation or ion diffusion or drift by means of electrolytic charging. The value of z may be chosen in such a way that the remaining $Si_{1-z}Ge_z$ layer 808 can be etched selectively by KOH or TMAH. The layers 806 and 810 may also be some other materials, for example pure Ge, or some III-V materials, under the condition that the Ge concentration x in the graded $Si_{1-x}Ge_x$ buffer layer 804 is increased from zero to 1.

After all the semiconductor-on-insulator substrate obtained by the approaches described above, various device layers can be further grown on the top. Before the regrowth, CMP maybe used to polish the surface.

Although the present invention has been shown and described with respect to several preferred embodiments thereof, various changes, omissions and additions to the form and detail thereof, may be made therein, without departing from the spirit and scope of the invention.

What is claimed is:

1. A semiconductor structure comprising:
   a substrate including an insulator layer; and
   a device layer disposed over the insulator layer, the device layer comprising at least one of strained Si, strained $Si_{1-w}Ge_w$, strained Ge, GaAs, AlAs, ZnSe, and InGaP.

2. The structure of claim 1 wherein a surface of the structure has a root mean square surface roughness of less than about 11 nanometers.

3. The structure of claim 1, further comprising:
   a device integrated into at least a portion of the device layer.

4. The semiconductor structure of claim 1, wherein the substrate comprises silicon.

5. A semiconductor structure comprising:
   a substrate comprising silicon;
   an insulating layer disposed over the substrate; and
   a relaxed $Si_{1-y}Ge_y$ layer disposed over and in contact with the insulating layer,
   wherein a Ge concentration y of the relaxed layer is selected from the range of greater than zero to 1.

6. The structure of claim 5 wherein the Ge concentration y has a value of 1.

7. The structure of claim 5, further comprising:
   a device disposed within at least a portion of the relaxed $Si_{1-y}Ge_y$ layer.

8. The structure of claim 1, wherein the device layer comprises strained $Si_{1-w}Ge_w$.

9. The structure of claim 1, wherein the device layer comprises strained Ge.

* * * * *

UNITED STATES PATENT AND TRADEMARK OFFICE
CERTIFICATE OF CORRECTION

| | | |
|---|---|---|
| PATENT NO. | : 6,921,914 B2 | Page 1 of 1 |
| APPLICATION NO. | : 10/802185 | |
| DATED | : July 26, 20005 | |
| INVENTOR(S) | : Cheng et al. | |

It is certified that error appears in the above-identified patent and that said Letters Patent is hereby corrected as shown below:

Title page and Col. 1, Ln. 1, replace current title with --SEMICONDUCTOR SUBSTRATE STRUCTURE--

Column 1, between lines 14, ending "herein.", and line 16, beginning "BACKGROUND OF", insert the following paragraph:

--GOVERNMENT LICENSE RIGHTS

This invention was made with government support under Contract Number N66001-00-1-8954, awarded by the Navy. The government has certain rights in the invention.--

Signed and Sealed this

Nineteenth Day of June, 2007

JON W. DUDAS
*Director of the United States Patent and Trademark Office*